(12) United States Patent
Fang et al.

(10) Patent No.: US 10,740,587 B2
(45) Date of Patent: Aug. 11, 2020

(54) CAPACITIVE SENSING SYSTEM AND METHOD FOR VOLTAGE CALIBRATION OF THE SAME

(71) Applicant: SHENZHEN GOODIX TECHNOLOGY CO., LTD., Guangdong (CN)

(72) Inventors: Hsin-Wen Fang, Taipei (TW); Meng-Ta Yang, Taipei (TW)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 68 days.

(21) Appl. No.: 16/104,093

(22) Filed: Aug. 16, 2018

(65) Prior Publication Data
US 2018/0357458 A1   Dec. 13, 2018

Related U.S. Application Data

(63) Continuation of application No. PCT/CN2016/108232, filed on Dec. 1, 2016.

(51) Int. Cl.
*G06K 9/20*   (2006.01)
*G06K 9/00*   (2006.01)
(Continued)

(52) U.S. Cl.
CPC .......... *G06K 9/0002* (2013.01); *G01R 27/26* (2013.01); *G06K 9/03* (2013.01)

(58) Field of Classification Search
CPC ... G06K 9/0002; G06K 9/00006–0012; G06K 9/03–18; H04N 5/365–367; H04N 5/3658; H04N 1/00087
See application file for complete search history.

(56) References Cited

U.S. PATENT DOCUMENTS 5,065,444 A * 11/1991 Garber ............ G06T 5/20
            348/E5.035
5,987,156 A * 11/1999 Ackland ........... G06K 9/0002
            358/446

(Continued)

FOREIGN PATENT DOCUMENTS

CN    101325046 A    12/2008
CN    102004903 A    4/2011
(Continued)

OTHER PUBLICATIONS

M. Loose et al., "Self-calibrating logarithmic CMOS image sensor with single chip camera functionality", Contribution to IEEE CCD & AIS workshop, Karuizawa, Japan, 1999, 4 pages total. (Year: 1999).*

(Continued)

*Primary Examiner* — Brian Werner
(74) *Attorney, Agent, or Firm* — WPAT, P.C., Intellectual Property Attorneys; Anthony King

(57) ABSTRACT

A capacitive sensing system is provided, which includes: a pixel matrix for sensing a plurality of voltage variations generated by pressing of a fingerprint; and a calibration unit coupled to the pixel matrix and used for calibrating the plurality of voltage variation of the pixel matrix according to a control signal generated based on the plurality of voltage variations. The capacitive sensing system according to the present disclosure has advantages of improving the consistency of the voltage variations detected by the pixel units and reducing the occurrence of distortion.

14 Claims, 4 Drawing Sheets

(51) Int. Cl.
*G01R 27/26* (2006.01)
*G06K 9/03* (2006.01)

(56) References Cited

U.S. PATENT DOCUMENTS

| | | | | |
|---|---|---|---|---|
| 6,330,345 | B1* | 12/2001 | Russo | G06K 9/0002 |
| | | | | 348/218.1 |
| 8,446,158 | B1 | 5/2013 | Jansson | |
| 9,939,400 | B1* | 4/2018 | Gozzini | G06K 9/0002 |
| 2005/0024065 | A1 | 2/2005 | Umeda et al. | |
| 2007/0206113 | A1* | 9/2007 | Nakamura | G06K 9/00013 |
| | | | | 348/362 |
| 2014/0368363 | A1 | 12/2014 | Zhu et al. | |

FOREIGN PATENT DOCUMENTS

| CN | 102497531 A | 6/2012 |
|---|---|---|
| CN | 103679163 | 3/2014 |
| CN | 103870817 | 6/2014 |
| CN | 103870817 A | 6/2014 |
| CN | 105094477 A | 11/2015 |
| CN | 105528574 | 4/2016 |
| CN | 105528574 A | 4/2016 |

OTHER PUBLICATIONS

European Search Report for corresponding European application 16922669.3 dated Dec. 19, 2018.
English abstract translation of CN103870817.
English abstract translation of CN105528574.
English abstract translation of CN103679163.
International Search Report for PCT/CN2016/108232.
Written Opinion of the International Searching Authority for PCT/CN2016/108232.
English abstract translation of CN101325046A.
English abstract translation of CN102004903A.
English abstract translation of CN102497531A.
English abstract translation of CN103870817A.
English abstract translation of CN105094477A.
English abstract translation of CN105528574A.

* cited by examiner

CAPACITIVE SENSING SYSTEM AND METHOD FOR VOLTAGE CALIBRATION OF THE SAME

CROSS-REFERENCE TO RELATED APPLICATIONS

The present application is a continuation of international application No. PCT/CN2016/108232, filed on Dec. 1, 2016, of which is incorporated herein by reference in its entirety.

TECHNICAL FIELD

The disclosure relates to the field of electronics, and in particular to a capacitive sensing system and a method for voltage calibration of the same.

BACKGROUND

With the development and progress of science and technology, mobile electronic devices such as mobile phones, digital cameras, tablet computers, and notebook computers have become indispensable tools in people's lives. In order to effectively prevent the data inside the personal mobile electronic devices from being stolen, various protection methods have been devised accordingly, such as password verification, voiceprint identification, or fingerprint identification, wherein the fingerprint identification is widely used. In existing capacitive sensing devices, the capacitance variation generated by charging and discharging a capacitor is typically converted into original data value; however, since a distortion of the conversion voltage variation is caused by process offset or parasitic capacitance effect, errors or distortions in image processing are caused accordingly.

Therefore, how to provide a system for sensing capacitances to avoid occurrence of the above situation becomes one of the goals to be achieved in the industry.

SUMMARY

Therefore, a main object of the present disclosure is to provide a capacitive sensing system and a method for voltage calibration of the same, in which a voltage variation of a capacitive sensing device is calibrated by a resistor so as to prevent occurrence of image distortion.

In order to solve the above issues, the present disclosure provides a capacitive sensing system, including: a pixel matrix, arranged for sensing a plurality of voltage variations generated by pressing of a fingerprint; and a calibration unit, coupled to the pixel matrix, the calibration unit being used for calibrating the plurality of voltage variations of the pixel matrix according to a control signal generated based on the plurality of voltage variations.

For instance, the capacitive sensing system further includes: an analog-to-digital converter, coupled to the pixel matrix, the analog-to-digital converter being used for converting the plurality of voltage variations into a plurality of original pixel data values; and a control unit, coupled to the analog-to-digital converter, the control unit being used for generating the control signal based on the plurality of original pixel data values.

For instance, the pixel matrix includes a plurality of pixel units, and the plurality of pixel units correspond to the plurality of voltage variations respectively.

For instance, the calibration unit is a variable resistor which is used for generating a calibration voltage according to the control signal so as to adjust the plurality of voltage variations.

For instance, when a first original pixel data value corresponding to a first pixel unit is greater than a second original pixel data value corresponding to a second pixel unit which is located in the same row as the first pixel unit, the control signal is determined by the control unit according to a difference between the first original pixel data value and the second original pixel data value.

For instance, the calibration unit generates a voltage-drop current according to the control signal so as to reduce the voltage variation corresponding to the first pixel unit.

For instance, when the first original pixel data value corresponding to the first pixel unit is smaller than the second original pixel data value corresponding to the second pixel unit which is located in the same row as the first pixel unit, the control signal is determined by the control unit according to the difference between the first original pixel data value and the second original pixel data value.

For instance, the calibration unit generates the voltage-drop current according to the control signal so as to reduce the voltage variation corresponding to the second pixel unit.

For instance, the voltage variation is maintained by the calibration unit to be less than a voltage swing range of the analog-to-digital converter according to the control signal.

In order to solve the above issues, the present disclosure further provides a voltage calibration method for a pixel matrix, the method includes: determining a first original pixel data value corresponding to a first pixel unit and a second original pixel data value corresponding to a second pixel unit which is located in the same row as the first pixel unit; determining a control signal according to a difference between the first original pixel data value and the second original pixel data value; and adjusting the first original pixel data value corresponding to the first pixel unit or the second original pixel data value corresponding to the second pixel unit according to the control signal.

For instance, the method further includes: when the first original pixel data value corresponding to the first pixel unit is greater than the second original pixel data value corresponding to the second pixel unit which is located in the same row as the first pixel unit, determining the control signal according to the difference between the first original pixel data value and the second original pixel data value; and generating a voltage-drop current according to the control signal so as to reduce the first original pixel data value corresponding to the first pixel unit.

For instance, the method further includes: when the first original pixel data value corresponding to the first pixel unit is smaller than the second original pixel data value corresponding to the second pixel unit which is located in the same row as the first pixel unit, determining the control signal according to the difference between the first original pixel data value and the second original pixel data value; and generating a voltage-drop current according to the control signal so as to reduce the second original pixel data value corresponding to the second pixel unit.

The capacitive sensing system according to the present disclosure has advantages of improving the consistency of voltage variations detected by pixel units and avoiding the distortion during image processing.

DETAILED DESCRIPTION OF THE EMBODIMENT(S)

In order to make the objects, technical solutions and advantages of the disclosure clearer and more apparent, the disclosure will be further described below in detail with reference to the embodiments and the accompanying drawings. It should be noted that the specific embodiments described herein are merely used to explain the disclosure, and are not intended to limit the disclosure.

Figure 1:
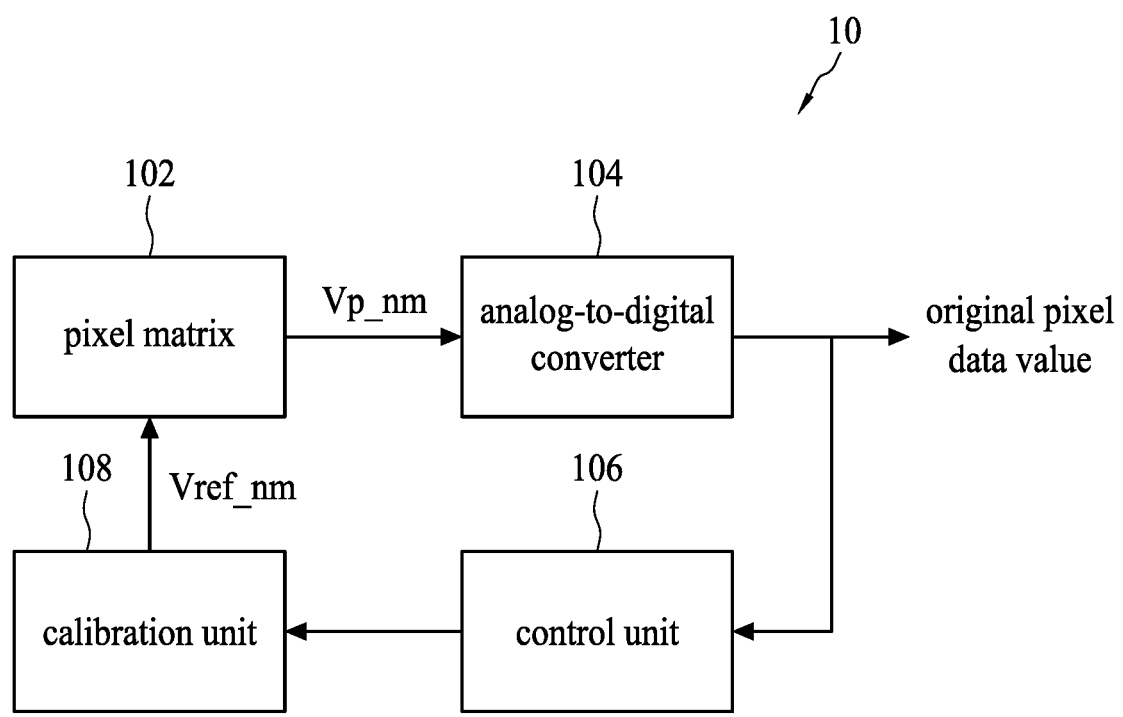
FIG. 1 is a schematic diagram of a capacitive sensing system according to some embodiments of the present disclosure.

Reference is made to FIG. 1, which is a schematic diagram of a capacitive sensing system 10 according to some embodiments of the present disclosure. The capacitive sensing system 10 may be implemented in a form of a touch screen device, a capacitive sensing device or a fingerprint identification device so as to sense the images sensed by the touch screen device or the fingerprint identification device. The capacitive sensing system 10 includes: a pixel matrix 102, an analog-to-digital converter 104, a control unit 106 and a calibration unit 108. The pixel matrix 102 is a matrix of pixel units including n columns and m rows, and is used for sensing a plurality of voltage variations $V_{p\_nm}$ (where n and m represent a pixel unit located in the $n^{th}$ column and the $m^{th}$ row respectively in the pixel matrix 102) corresponding to the pixel matrix 102, which are generated when a fingerprint presses on a capacitive sensing device. The analog-to-digital converter 104 is coupled to the pixel matrix 102, and is used for converting the plurality of voltage variations $V_{p\_nm}$ into a plurality of original pixel data values. The control unit 106 is coupled to the analog-to-digital converter 104, and is used for generating a control signal based on the plurality of original pixel data values. The control unit 106 may be implemented by way of a computer. The calibration unit 108 is coupled to the control unit 106, and is used for calibrating the voltage variations $V_{p\_nm}$ of the pixel matrix 102 according to the control signal generated by the control unit 106, thus avoiding the distortion of the voltage variations $V_{p\_nm}$.

A capacitance error $\Delta C_s$ may be introduced to the capacitance sensing device due to the process offset or parasitic capacitance effect. Therefore, capacitive sensing results of the pixel units may not be completely the same to each other. In this case, a voltage error $\Delta V_p$ may be introduced to the voltage variations $V_{p\_nm}$ of the pixel units due to the capacitance error $\Delta C_s$, and thus the voltage variations $V_{p\_nm}$ of the pixel unit may exceed a range of a voltage swing $V_{swing}$ of the analog-to-digital converter 104, which causes distortion of the output original pixel data values and erroneous determination.

Hence, in the capacitive sensing system 10 of the present disclosure, when the capacitive sensing device is pressed by a fingerprint, the voltage variations $V_{p\_nm}$ corresponding to individual pixel units are generated by the pixel matrix 102 through charging and discharging capacitors. After the voltage variations $V_{p\_nm}$ of the individual pixel units are converted by the analog-to-digital converter 104 into original pixel data values, a control signal is generated by the control unit 106 based on the plurality of original pixel data values obtained after conversion, and is transmitted to the calibration unit 108. Then, a calibration voltage $V_{ref\_nm}$ (where n and m represent a pixel unit of the $n^{th}$ column and the $m^{th}$ row respectively in the pixel matrix 102) is generated by the calibration unit 108 according to the control signal, so as to adjust the voltage variations $V_{p\_nm}$ of the pixel units. It should be noted that in the present embodiment, the calibration unit 108 may be a variable resistor or other devices which generate a variable impedance to change the voltage of a node where the calibration unit 108 is located, and the disclosure is not limited to this.

Figure 2:
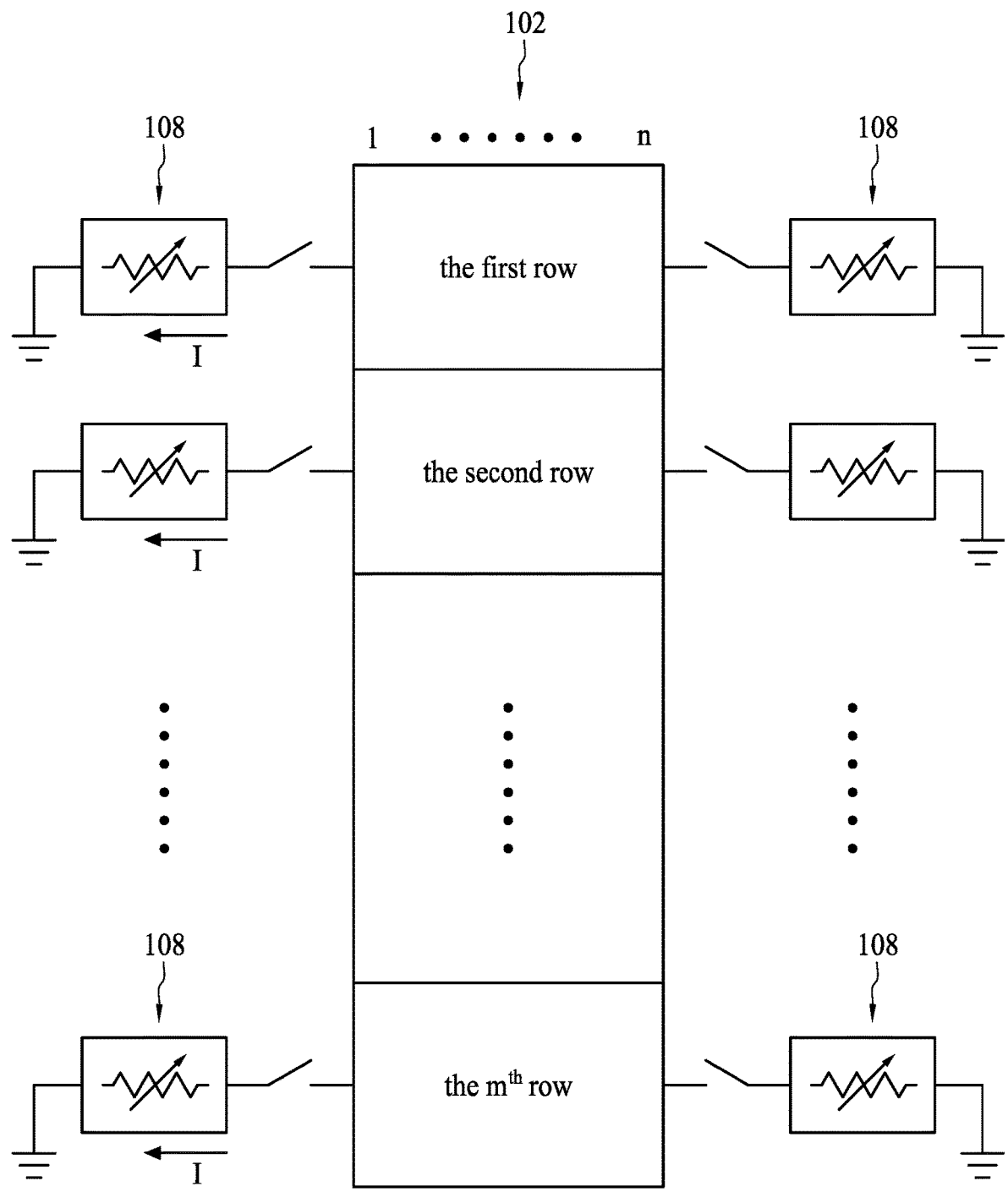
FIG. 2 is a schematic diagram of a pixel matrix and a calibration unit according to some embodiments of the present disclosure.
Figure 3:
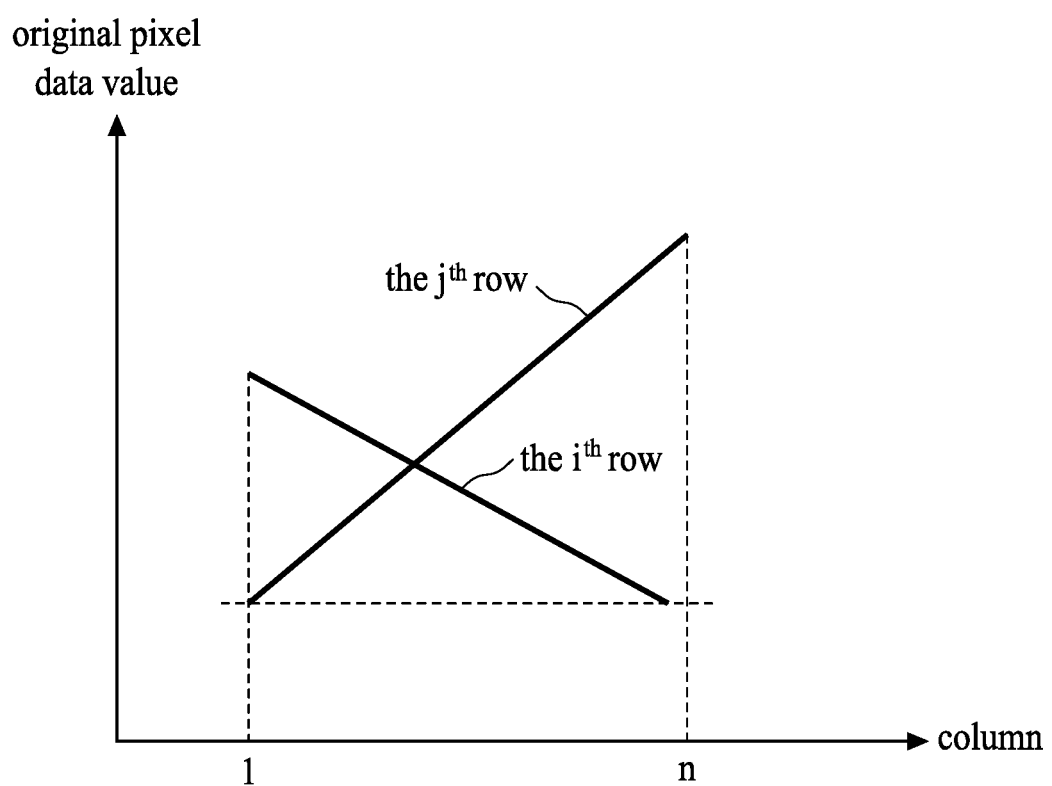
FIG. 3 is a schematic diagram of the distribution of original pixel data values of pixel units in the same row that are not calibrated according to some embodiments of the present disclosure.

To elaborate, FIG. 2 is a schematic diagram of the pixel matrix 102 and the calibration unit 108 according to some embodiments of the present disclosure. Since each of the pixel units in the same row of the pixel matrix 102 is influenced by a capacitance effect, the voltage variations of the pixel units in the same row exhibit a linearly ascending or descending trend. Reference is made to FIG. 3, which is a schematic diagram of the distribution of original pixel data values of pixel units in the same row that are not calibrated according to some embodiments of the present disclosure. In this embodiment, a voltage-drop current I is generated when the variable resistor of the calibration unit 108 is turned on, so as to reduce a voltage variation $V_{p\_nm}$ of the first pixel unit in the same row or the $n^{th}$ pixel unit in the same row, and to further adjust a voltage variation $V_{p\_nm}$ of each pixel unit in the same row. For example, the first pixel unit and the $n^{th}$ pixel unit of the pixel units in the $i^{th}$ row have a corresponding first original pixel data value and a corresponding $n^{th}$ original pixel data value, respectively. As shown in FIG. 3, a line denoted as the $i^{th}$ row represents the distribution of the original pixel data values of the pixel units in the $i^{th}$ row in the pixel array 102. The first original pixel data value is greater than the $n^{th}$ original pixel data value, which means that the first original pixel unit is influenced by capacitance process offset or parasitic capacitance effect such that the first original pixel data value is greater than the $n^{th}$ original pixel data value. Hence, a control signal is generated by the control unit 106 and is transmitted to the calibration unit 108. Then, a calibration voltage $V_{ref\_11}$ is determined by the calibration unit 108 according to a difference between the first original pixel data value and the $n^{th}$ original pixel data value, in order to reduce the voltage variation $V_{p\_11}$ corresponding to the first pixel unit. In this example, the calibration voltage $V_{ref\_11}$ is generated by the calibration unit 108 so as to reduce the voltage variation $V_{p\_11}$ corresponding to the first pixel unit, and the voltage variation $V_{p\_11}'$ of the first pixel unit after calibration is:

$$V_{p\_11}' = (V_{p\_11} - V_{ref\_11}) \qquad (1)$$

Figure 4:
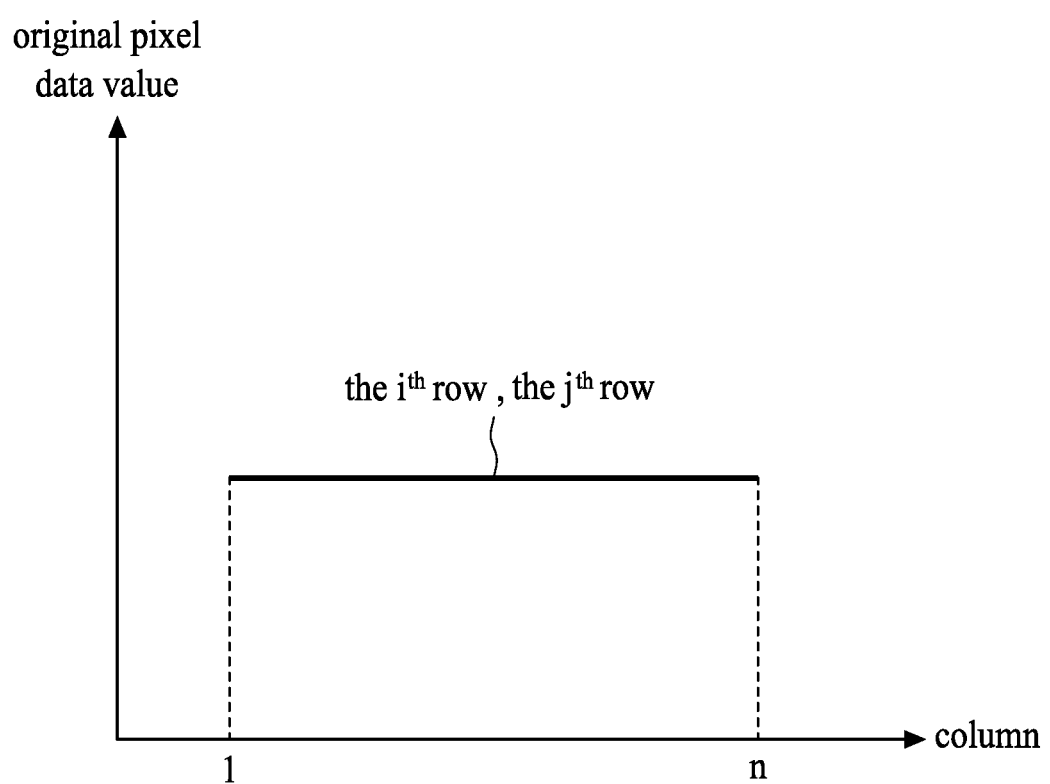
FIG. 4 is a schematic diagram of the distribution of original pixel data values of pixel units in the same row after calibration according to some embodiments of the present disclosure.

In this way, as shown in FIG. 4, the voltage variation $V_{p\_11}$ of the first original pixel data value corresponding to the first pixel unit can be reduced using the calibration voltage $V_{ref\_11}$. Therefore, the first original pixel data value after calibration is consistent with the $n^{th}$ original pixel data value in the $i^{th}$ row.

Likewise, when the first original pixel data value is smaller than the $n^{th}$ original pixel data value, that is, as shown in FIG. 3, in which a line denoted as the $j^{th}$ row represents the distribution of the original pixel data values of the pixel units in the $j^{th}$ row in the pixel array 102, when the $n^{th}$ original pixel unit in the $j^{th}$ row is influenced by capacitance process offset or parasitic capacitance effect, the first original pixel data value is smaller than the $n^{th}$ original pixel data value. Hence, a control signal is generated by the control unit 106 and is transmitted to the calibration unit 108. Then, a calibration voltage $V_{ref\_ln}$ can be determined by the calibration unit 108 according to a difference between the first original pixel data value and the $n^{th}$ original pixel data value so as to reduce the voltage variation $V_{p\_ln}$ corresponding to the $n^{th}$ pixel unit. For example, the voltage variation of the $n^{th}$ pixel unit generated due to fingerprint pressing is $V_{p\_ln}$, and the voltage variation $V_{p\_ln}'$ of the $n^{th}$ pixel unit after calibration is:

$$V_{p\_ln}'=(V_{p\_ln}-V_{ref\_ln}) \qquad (2)$$

In this way, as shown in FIG. 4, the voltage variation $V_{p\_ln}$ of the $n^{th}$ original pixel data value corresponding to the $n^{th}$ pixel unit can be reduced using the calibration voltage $V_{ref\_ln}$. Therefore, the first original pixel data value is consistent with the $n^{th}$ original pixel data value after calibration in the $j^{th}$ row.

In light of the above, as shown in FIG. 3, the original pixel data values without being calibrated by the calibration unit 108 may be distorted due to the process offset or parasitic capacitance effect, and therefore the distribution of the original pixel data values exhibits no consistency (that is, the original pixel data values of individual pixel units in the same row are not completely the same). In contrast, as shown in FIG. 4, the consistency of the original pixel data values of the pixel units in the same row may be improved after being calibrated one by one by the calibration unit 108 so that the voltage variation $V_{p\_nm}$ output by the pixel unit does not exceed a voltage swing range $V_{swing}$ of the analog-to-digital converter 104. Therefore, the original pixel data values are distributed with consistency, thus reducing the distortion situation.

It should be noted that the foregoing embodiments are used to explain the concept of the present disclosure, various modifications can be made by those skilled in the art based on the foregoing embodiments, and the disclosure is not limited to the foregoing embodiments. For example, not only the voltage calibration can be performed by the calibration unit 108 of the present disclosure on the first pixel unit and the $n^{th}$ pixel unit in the same row of the pixel matrix 102 (as described in the foregoing embodiments), but also the voltage calibration can be performed by the calibration unit 108 on any two pixel units in the same row of the pixel matrix 102 (for example, the third pixel unit and the fifth pixel unit in the same row of the pixel matrix); alternatively, the voltage calibration may be performed by the calibration unit 108 on more than two pixel units in the same row of the pixel matrix 102, and the voltage calibration is further performed on all the pixel units in the pixel matrix 102 after the pixel units in the same row of the pixel matrix 102 are calibrated. In addition, in some embodiments of the present disclosure, other methods for adjusting voltage (such as capacitance, inductance or the like) may be used so that the voltage variation does not exceed a voltage swing range $V_{swing}$ of the analog-to-digital converter 104. Alternatively, the calibration unit 108 may adjust not only the voltage of the node where the variable resistor is located by generating the voltage-drop current I, but also adjust the voltage variations $V_{p\_nm}$ of the pixel units by increasing the voltage of the node where the calibration unit 108 is located, and the disclosure is not limited to this. All the above described methods will fall within the scope of the present disclosure.

In summary, according to the present disclosure, the voltage variations detected by the pixel units are calibrated so as to improve the consistency of the voltage variations, thereby reducing distortions in image processing.

The above description merely relates to preferred embodiments of the present disclosure and is not intended to limit the present disclosure. Any change, equivalent substitution, improvements or the like made within the spirit and principles of the present disclosure should be considered as falling within the scope of protection of the present disclosure.

What is claimed is:

1. A capacitive sensing system, comprising:
   a pixel matrix, arranged for sensing a plurality of voltage variations generated by pressing of a fingerprint;
   an analog-to-digital converter, coupled to the pixel matrix, the analog-to-digital converter being used for converting the plurality of voltage variations into a plurality of original pixel data values;
   a control unit, coupled to the analog-to-digital converter, the control unit being used for generating the control signal based on the plurality of original pixel data values; and
   a calibration unit, coupled to the pixel matrix, the calibration unit including a variable resistor for generating a calibration voltage according to the control signal to adjust the plurality of voltage variations;
   wherein when a first original pixel data value corresponding to a first pixel unit is greater than a second original pixel data value corresponding to a second pixel unit which is located in the same row as the first pixel unit, the control unit generates the control signal according to a difference between the first original pixel data value and the second original pixel data value, so that in response to the calibration voltage, the generated calibration voltage adjusts the voltage variation corresponding to the first pixel unit to allow the first original pixel data to be consistent with the second original pixel data.

2. The capacitive sensing system of claim 1, wherein the pixel matrix comprises a plurality of pixel units, and the plurality of pixel units correspond to the plurality of voltage variations respectively.

3. The capacitive sensing system of claim 1, wherein the calibration unit generates a voltage-drop current according to the control signal so as to reduce the voltage variation corresponding to the first pixel unit.

4. The capacitive sensing system of claim 1, wherein when the first original pixel data value corresponding to the first pixel unit is smaller than the second original pixel data value corresponding to the second pixel unit which is located in the same row as the first pixel unit, the control signal is determined by the control unit according to the difference between the first original pixel data value and the second original pixel data value.

5. The capacitive sensing system of claim 4, wherein the calibration unit generates a voltage-drop current according to the control signal so as to reduce the voltage variation corresponding to the second pixel unit.

6. The capacitive sensing system of claim 1, wherein the voltage variation is maintained by the calibration unit to be less than a voltage swing range of the analog-to-digital converter according to the control signal.

7. A voltage calibration method for a pixel matrix, the method comprising:
   determining a first original pixel data value corresponding to a first pixel unit and a second original pixel data value corresponding to a second pixel unit which is located in the same row as the first pixel unit;

determining a control signal according to a difference between the first original pixel data value and the second original pixel data value; and generating a voltage-drop current according to the control signal and using the voltage-drop current to adjust the first original pixel data value corresponding to the first pixel unit or the second original pixel data value corresponding to the second pixel unit to allow the first original pixel data to be consistent with the second original pixel data.

8. The method of claim 7, further comprising:

when the first original pixel data value corresponding to the first pixel unit is smaller than the second original pixel data value corresponding to the second pixel unit which is located in the same row as the first pixel unit, determining the control signal according to the difference between the first original pixel data value and the second original pixel data value; and generating a voltage-drop current according to the control signal so as to reduce the second original pixel data value corresponding to the second pixel unit.

9. The method of claim 7, wherein the determining a first original pixel data value corresponding to a first pixel unit and a second original pixel data value corresponding to a second pixel unit comprises:

sensing a first voltage variation and a second voltage variation corresponding to the first pixel unit and the second pixel unit when a fingerprint is pressed on the pixel matrix; and converting the first voltage variation and the second voltage variation into the first original pixel data value and the second original pixel data value, respectively.

10. The method of claim 7, wherein the first original pixel data value and the second original pixel data value are adjusted by a calibration unit, and the calibration unit comprises a variable resistor for generating a calibration voltage according to the control signal.

11. A fingerprint identification device, comprising a capacitive sensing system, wherein the capacitive sensing system comprises:

a pixel matrix, arranged for sensing a plurality of voltage variations, the voltage variations are generated when a fingerprint is pressed on the fingerprint identification device;

an analog-to-digital converter, coupled to the pixel matrix, the analog-to-digital converter being used for converting the plurality of voltage variations into a plurality of original pixel data values;

a control unit, coupled to the analog-to-digital converter, the control unit being used for generating the control signal based on the plurality of original pixel data values; and a calibration unit, coupled to the pixel matrix, the calibration unit including a variable resistor for generating a calibration voltage according to the control signal to adjust the plurality of voltage variations;

wherein when a first original pixel data value corresponding to a first pixel unit is greater than a second original pixel data value corresponding to a second pixel unit which is located in the same row as the first pixel unit, the control unit generates the control signal according to a difference between the first original pixel data value and the second original pixel data value, so that in response to the calibration voltage, the generated calibration voltage adjusts the voltage variation corresponding to the first pixel unit to allow the first original pixel data to be consistent with the second original pixel data.

12. The fingerprint identification device of claim 11, wherein the pixel matrix comprises a plurality of pixel units, each of which corresponds to a respective one of the plurality of voltage variations.

13. The fingerprint identification device of claim 11, wherein the calibration unit generates a voltage-drop current according to the control signal so as to reduce the voltage variation corresponding to the second pixel unit.

14. The capacitive sensing system of claim 12, wherein the voltage variation is maintained by the calibration unit to be less than a voltage swing range of the analog-to-digital converter according to the control signal.

* * * * *